(12) United States Patent
Leal Cervantes et al.

(10) Patent No.: US 11,756,784 B2
(45) Date of Patent: Sep. 12, 2023

(54) METHODS FOR ALUMINUM OXIDE SURFACE RECOVERY

(71) Applicant: APPLIED MATERIALS, INC., Santa Clara, CA (US)

(72) Inventors: Carmen Leal Cervantes, Mountain View, CA (US); Alexander Jansen, San Jose, CA (US); Xiangjin Xie, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/857,361

(22) Filed: Jul. 5, 2022

(65) Prior Publication Data

US 2022/0336207 A1    Oct. 20, 2022

Related U.S. Application Data (62) Division of application No. 16/906,999, filed on Jun. 19, 2020, now Pat. No. 11,443,936.

(51) Int. Cl.
   *H01L 21/02*    (2006.01)

(52) U.S. Cl.
   CPC .............................. *H01L 21/02043* (2013.01)

(58) Field of Classification Search
   CPC .................... H01L 21/02043; H01L 21/02071
   See application file for complete search history.

(56) References Cited

U.S. PATENT DOCUMENTS

| | | | |
|---|---|---|---|
| 5,880,032 A | 3/1999 | Doi et al. | |
| 8,871,358 B2 | 10/2014 | Jiang et al. | |
| 9,245,739 B2 | 1/2016 | Ndiege et al. | |
| 9,245,793 B2 | 1/2016 | Limdulpaiboon et al. | |
| 2005/0215053 A1 | 9/2005 | Soininen et al. | |
| 2006/0137710 A1* | 6/2006 | Lim | C23F 4/00 134/1.1 |
| 2007/0054487 A1 | 3/2007 | Ma et al. | |
| 2008/0044990 A1 | 2/2008 | Lee | |
| 2011/0094679 A1 | 4/2011 | Dong et al. | |
| 2012/0285481 A1* | 11/2012 | Lee | C23C 16/0245 134/1.1 |
| 2013/0157409 A1 | 6/2013 | Vaidya et al. | |
| 2017/0098540 A1* | 4/2017 | Xie | B08B 9/027 |
| 2019/0206794 A1 | 7/2019 | Rha et al. | |

OTHER PUBLICATIONS

Notification Concerning Transmittal of International Preliminary Report and Patentability for PCT/US2021/037384 dated Dec. 29, 2022.

* cited by examiner

*Primary Examiner* — Douglas Lee
(74) *Attorney, Agent, or Firm* — MOSER TABOADA (57) ABSTRACT

A method of cleaning a surface of a substrate uses alcohol and water treatments. The method may include applying an alcohol treatment on a surface of the substrate with the alcohol treatment configured to provide surface reduction and applying a water treatment to the surface of the substrate with the water treatment configured to enhance selectivity of at least a portion of the surface for a subsequent barrier layer process by removing alcohol from the at least a portion of the surface. The water treatment may be performed simultaneously with the alcohol treatment or performed after the alcohol treatment. The water treatment may include vaporized water or water injected into a plasma to produce hydrogen or oxygen radicals.

20 Claims, 5 Drawing Sheets

METHODS FOR ALUMINUM OXIDE SURFACE RECOVERY

CROSS-REFERENCE TO RELATED APPLICATIONS

This application is a divisional of co-pending U.S. patent application Ser. No. 16/906,999, filed Jun. 19, 2020, which is herein incorporated by reference.

FIELD

Embodiments of the present principles generally relate to semiconductor processing of semiconductor substrates.

BACKGROUND

Process chambers configured to perform a preclean process are configured to remove native oxide on metal contact pads of a substrate prior to depositing one or more barrier layers on the substrate and to remove other materials. Preclean chambers, typically, use ion bombardment (induced by RF plasma) to remove the native oxide on metal contacts by etching the native oxide from the substrate or use radicals (generated by remote plasma) to reduce metal with chemical reaction from the substrate. In some cases, an alcohol is used to reduce the native oxide. The preclean process lowers contact resistance of the metal contacts on the substrate to enhance performance and power consumption of integrated circuits on the substrate and to promote adhesion. To perform a plasma cleaning process, a substrate comprising an integrated circuit is placed in a remote plasma chamber and a pump removes most of the air from the chamber. Electromagnetic energy (e.g., radio frequency) is applied to an injected gas in a remote plasma source, such as argon or hydrogen, to excite the injected gas into a plasma state. The plasma releases ions or radicals that remove contaminants and/or material from the substrate. Atoms or molecules of the contaminants and/or substrate material are etched from the substrate and are, for the most part, pumped out of the chamber. However, the inventors have observed that alcohols may still remain on the substrate after the cleaning process. The residual alcohol then affects subsequent processes such as barrier layer formation.

Accordingly, the inventors have provided improved methods and apparatus to remove residual alcohols from the substrate surface.

SUMMARY

Methods for removing residual alcohols from the substrate surface are provided herein.

In some embodiments, a method of cleaning a surface of a substrate may comprise applying an alcohol treatment on a surface of the substrate, the alcohol treatment configured to provide surface reduction and applying a water treatment to the surface of the substrate, the water treatment configured to enhance selectivity of at least a portion of the surface of the substrate for a subsequent barrier layer process by removing alcohol from the at least a portion of the surface.

In some embodiments, the method may further include wherein the alcohol treatment and the water treatment are performed simultaneously, wherein the water treatment is performed at a temperature of approximately 60 degrees Celsius to approximately 450 degrees Celsius, wherein the water treatment is performed at a pressure of greater than zero Torr to approximately 1 Torr, wherein the water treatment is performed at a pressure of approximately 500 mTorr, wherein the water treatment includes flowing vaporized water over the surface of the substrate, wherein the vaporized water is flowed over the surface of the substrate for a duration of approximately 10 seconds to approximately 60 seconds, wherein the water treatment includes exposing the surface of the substrate to radicals from a plasma produced with water, wherein the water treatment has a duration of approximately 5 seconds to approximately 120 seconds, wherein the water treatment includes a water treatment mixture including a carrier gas and water used to produce the plasma, wherein the water treatment mixture has greater than zero to approximately 100% water, wherein the water treatment mixture has approximately 50% water, and/or wherein the carrier gas is helium or argon.

In some embodiments, a method of cleaning a surface of a substrate may comprise applying an alcohol treatment on a surface of the substrate, the alcohol treatment configured to provide surface reduction and applying a water treatment to the surface of the substrate for a duration of approximately 5 seconds to approximately 120 seconds at a temperature of approximately 60 degrees Celsius to approximately 450 degrees Celsius and a pressure of greater than zero Tor to approximately 1 Torr, wherein the water treatment includes exposing the surface of the substrate to hydrogen radicals or oxygen radicals generated by injecting a water treatment mixture into plasma, and wherein the water treatment is configured to enhance selectivity of at least a portion of the surface of the substrate for a subsequent barrier layer process by removing alcohol from the portion of the surface.

In some embodiments, the method may further include wherein the water treatment mixture includes water and a carrier gas, wherein the carrier gas is helium or argon, wherein the water treatment mixture contains greater than zero to approximately 100% water, and/or wherein the water treatment mixture contains approximately 50% water and approximately 50% of the carrier gas.

In some embodiments, a non-transitory, computer readable medium having instructions stored thereon that, when executed, cause a method for cleaning a surface of a substrate to be performed, the method may comprise applying an alcohol treatment on a surface of the substrate, the alcohol treatment configured to provide surface reduction and applying a water treatment to the surface of the substrate, the water treatment configured to enhance selectivity of at least a portion of the surface of the substrate for a subsequent barrier layer process by removing alcohol from the at least a portion of the surface.

In some embodiments, the non-transitory, computer readable medium of claim 19, further include flowing vaporized water over the surface of the substrate as the water treatment after performing the alcohol treatment, performing the alcohol treatment and the water treatment simultaneously, or exposing the surface of the substrate with hydrogen radicals or oxygen radicals generated from water injected into plasma.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide surface recovery processes that restore selectivity of portions of the substrate surface for subsequent barrier layer formation. A water treatment is performed with or after an alcohol treatment to facilitate in removing any alcohol from the surface. The water treatment may include flowing vaporized water (vapor draw, bubbling, or with a carrier gas and the like) over the surface or exposing the surface to hydrogen and/or oxygen radicals produced from injecting water into a plasma formed in a remote plasma source (RPS). The water treatment can occur in a preclean chamber after the reduction of substrate surfaces and does not impact the reduction performance. Moreover, the water flow process does not damage low k materials. The water treatment helps to recover the surface for processes such as atomic layer deposition (ALD) without nucleation delay or selectivity impact.

In substrates for which a preclean treatment cannot reduce the oxide, a residue is left behind that impacts the growth of a barrier in subsequent process steps. The methods and apparatus of the present principles provide water treatments that prevent the nucleation delay. For example, the water treatments may be used on etch stop layers with aluminum oxide that are sometimes found near the bottom of vias on a sidewall of the via. Without the water treatment, the etch stop layer will be resistant to formation of subsequent tantalum nitride barrier layer formation, causing a thinning of the barrier layer on the etch stop layer, reducing performance. The inventors have found that the water treatment has an absorptive effect on alcohols such as, but not limited to, ethanol and/or methanol on surfaces such as aluminum oxide.

Figure 1:
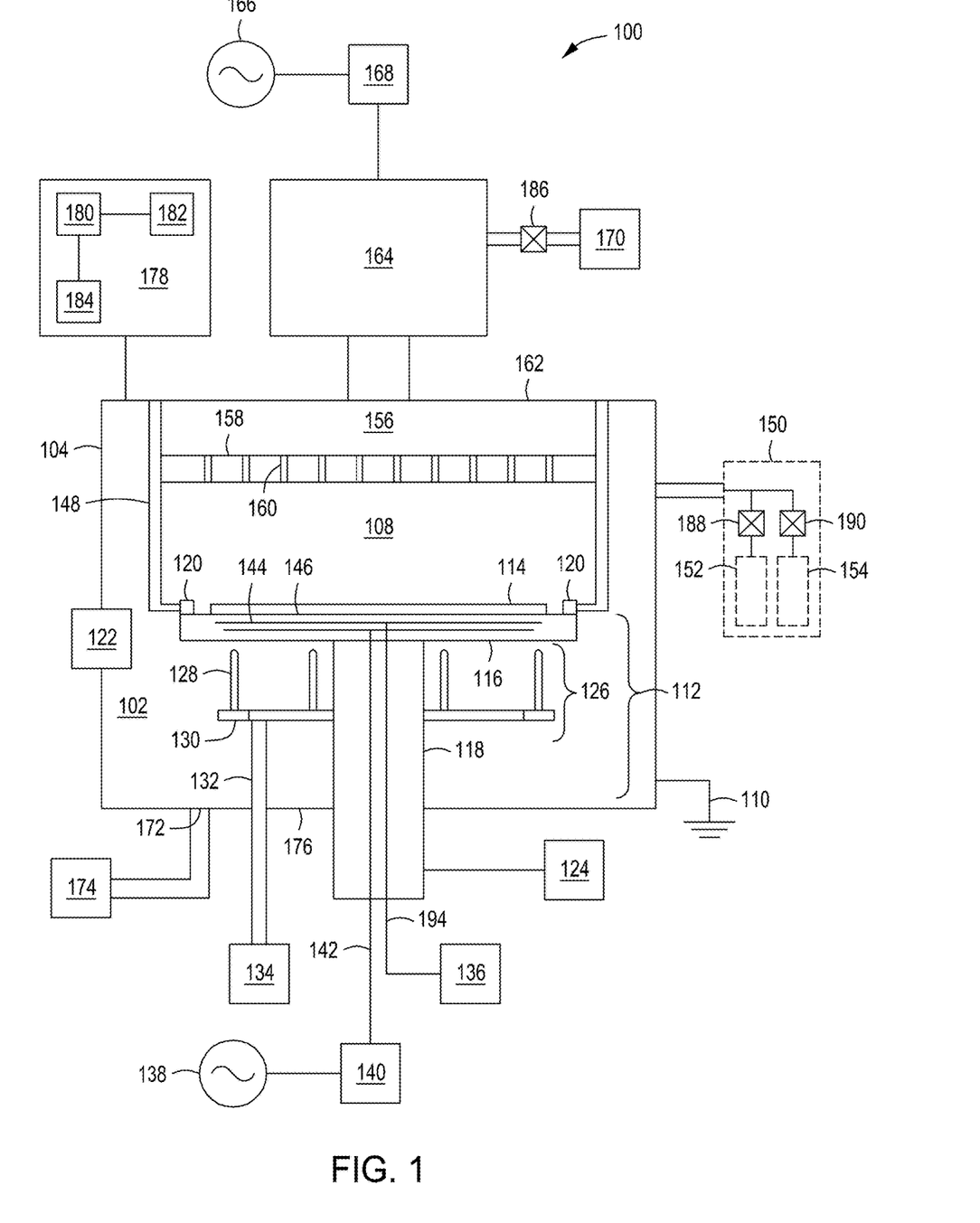
FIG. 1 depicts a cross-sectional view of a preclean chamber in accordance with some embodiments of the present principles.

The methods and apparatus of the present principles may be practiced in chambers such as the chamber described in FIG. 1. However, the chamber of FIG. 1 is an example, for the sake of brevity, and is not meant to be limiting in any manner. FIG. 1 depicts a cross-sectional view of a preclean chamber 100 having an integrated surface modification capability. The preclean chamber 100 is a vacuum chamber which is adapted to maintain sub-atmospheric pressures within an interior volume 102 during substrate processing. In some embodiments, the preclean chamber 100 can maintain a pressure of approximately 1 mTorr to 100 Torr. The preclean chamber 100 includes a chamber body 104 which encloses a processing volume 108 located in the upper half of the interior volume 102. The chamber body 104 may be made of metal, such as aluminum and the like. The chamber body 104 may be grounded via a coupling to ground 110.

A substrate support 112 is disposed within the interior volume 102 to support and retain a substrate 114, such as a semiconductor wafer, for example, or other such substrate. The substrate support 112 may generally comprise a pedestal 116 and a hollow support shaft 118 for supporting the pedestal 116. The pedestal 116 may be composed of an aluminum-based material or a ceramic-based material and the like. A pedestal formed of a ceramic-based material may be used for high temperature processes. The hollow support shaft 118 provides a conduit to provide, for example, backside gases, process gases, fluids, coolants, power, or the like, to the pedestal 116. In some embodiments, the substrate support 112 includes a focus ring 120 disposed about the pedestal 116 to enhance process uniformity at an edge of the substrate 114. In some embodiments, the focus ring 120 is made of quartz-based materials. In some embodiments, the focus ring 120 is made of ceramic-based materials. The ceramic-based material facilitates high pressure process capabilities. A slit valve 122 may be coupled to the chamber body 104 to facilitate in transferring the substrate 114 into and out of the interior volume 102.

In some embodiments, the hollow support shaft 118 is coupled to a lift actuator 124, such as a motor, which provides vertical movement of the pedestal 116 between an upper, processing position, and a lower, transfer position. A substrate lift 126 can include lift pins 128 mounted on a platform 130 connected to a shaft 132 which is coupled to a second lift actuator 134 for raising and lowering the substrate lift 126 so that the substrate 114 may be placed on or removed from the pedestal 116. The pedestal 116 may include through-holes to receive the lift pins 128. The hollow support shaft 118 provides a path for a gas conduit 194 for coupling a backside gas supply 136 and/or an RF power supply 138 to the pedestal 116. In some embodiments, the RF power supply 138 provides bias power through a matching network 140 to a power conduit 142 to the pedestal 116. In some embodiments, RF energy supplied by the RF power supply 138 may have a frequency of about 2 MHz or greater. In some embodiments, the RF power supply 138 may have a frequency of about 13.56 MHz.

In some embodiments, the backside gas supply 136 is disposed outside of the chamber body 104 and supplies gas to the pedestal 116. In some embodiments, the pedestal 116 includes a gas channel 144, allowing gas to interact with a backside of the substrate 114 to maintain a given temperature. The gas channel 144 is configured to provide backside gas, such as nitrogen (N), argon (Ar), or helium (He), to an upper surface 146 of the pedestal 116 to act as a heat transfer medium. The gas channel 144 is in fluid communication with the backside gas supply 136 via gas conduit 194 to control the temperature and/or temperature profile of the substrate 114 during use. For example, the backside gas supply 136 can supply gas to cool and/or heat the substrate 114 during use. In some embodiments, the substrate 114 may be heated from approximately 60 degrees Celsius to approximately 450 degrees Celsius. The heating of the substrate 114 enhances the cleaning and water treatment processes.

The preclean chamber 100 includes a process kit circumscribing various chamber components to prevent unwanted reaction between such components and etched material and other contaminants. The process kit includes an upper shield 148. In some embodiments, the upper shield 148 may be made of metal, such as aluminum. In some embodiments, the process kit may be constructed of quartz. In some embodiments, the preclean chamber 100 is also coupled to and in fluid communication with an optional chemical delivery system 150 which may supply water to the preclean chamber 100 for processing a substrate disposed therein. In some embodiments, the optional chemical delivery system 150 may include one or more ampoules such as a first optional ampoule 152 and a second optional ampoule 154 to provide water and other chemicals for substrate processing. In some embodiments, the first optional ampoule 152 may contain liquid water that is used to deliver gas phase water (vaporized water) into the process chamber 100 by vapor draw, bubbling, or carrier gas and the like. In some embodiments, the water flow from the first optional ampoule 152 is controlled by a first flow valve 188 and the chemical flow from the second optional ampoule 154 is controlled by a second flow valve 190. In some embodiments, the second optional ampoule 154 may contain chemicals, such as, but not limited to, alcohols such as ethanol, methanol, that are used to facilitate in residue and/or oxide removal during surface recovery processes for the substrate 114. In some embodiments, the substrate 114 may be heated during an alcohol treatment and/or a water treatment of the substrate 114.

A showerhead 158 is located above the processing volume 108 and below a ceiling 162 of the chamber body 104, forming a plenum 156 above the showerhead 158. The showerhead 158 includes through-holes 160 to flow gases from the plenum 156 into the processing volume 108. An RPS 164 is fluidly connected to the plenum 156 to allow ionized gases to flow from the RPS 164 into the plenum 156, through the showerhead 158, and into the processing volume 108. Plasma is generated in the RPS by a plasma RF power source 166 that provides RF energy through a matching network 168 to the RPS 164. Process gases used to form the plasma are supplied by a plasma gas source 170 and controlled by a third flow valve 186. The plasma gases supplied by the plasma gas source 170 may include, but are not limited to, hydrogen, helium, and/or argon and the like. The RPS 164 produces radicals of the process gas to facilitate in cleaning residues and/or oxides from the substrate 114 to remove etching residue and/or to reduce metal oxides from the surface of the substrate 114. In some embodiments, the plasma gas source 170 may also supply water with or without a carrier gas, such as helium or argon, for example, that can be injected into the RPS to generate hydrogen radicals and/or oxygen radicals from plasma.

A pump port 172 is configured to facilitate removal of particles from the interior volume 102. The preclean chamber 100 is coupled to and in fluid communication with a vacuum system 174 which includes a throttle valve (not shown) and pump (not shown) which are used to exhaust the preclean chamber 100. In some embodiments, the vacuum system 174 is coupled to the pump port 172 disposed on a bottom surface 176 of the chamber body 104. The pressure inside the preclean chamber 100 may be regulated by adjusting the throttle valve and/or vacuum pump. In some embodiments, the pump has a flow rate of about 1900 liters per second to about 3000 liters per second. In some embodiments, the vacuum system 174 may be used to facilitate in regulating the substrate temperature.

In some embodiments, a controller 178 is used for the operation of the preclean chamber 100. The controller 178 may use direct control of the preclean chamber or alternatively, use indirect control of the preclean chamber by controlling computers (or controllers) associated with the preclean chamber 100. In operation, the controller 178 enables data collection and feedback from the preclean chamber 100 to optimize performance of the preclean chamber 100. The controller 178 generally includes a Central Processing Unit (CPU) 180, a memory 182, and a support circuit 184. The CPU 180 may be any form of a general-purpose computer processor that can be used in an industrial setting. The support circuit 184 is conventionally coupled to the CPU 180 and may comprise a cache, clock circuits, input/output subsystems, power supplies, and the like. Software routines, such as a method as described below may be stored in the memory 182 and, when executed by the CPU 180, transform the CPU 180 into a specific purpose computer (controller 178). The software routines may also be stored and/or executed by a second controller (not shown) that is located remotely from the preclean chamber 100.

The memory 182 is in the form of computer-readable storage media that contains instructions, when executed by the CPU 180, to facilitate the operation of the semiconductor processes and equipment. The instructions in the memory 182 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 2:
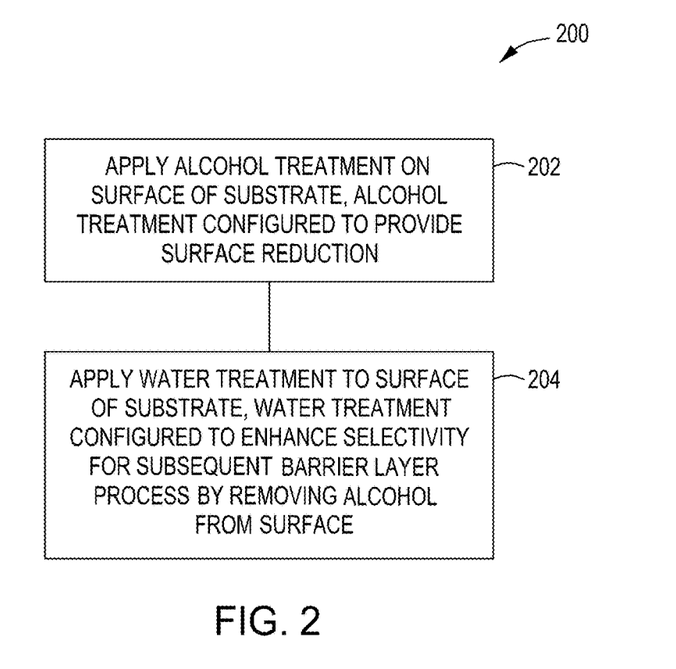
FIG. 2 is a method of processing a substrate in a preclean chamber in accordance with some embodiments of the present principles.
Figure 3:
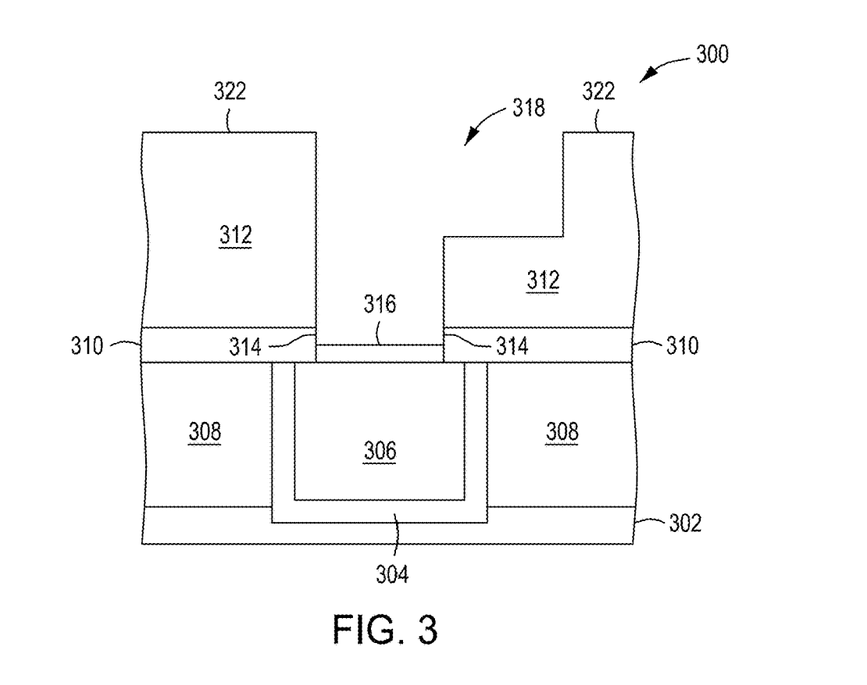
FIG. 3 depicts a cross-sectional view of a substrate surface with metal oxide in accordance with some embodiments of the present principles.

FIG. 2 is a method 200 of processing a substrate in a preclean chamber in accordance with some embodiments. In block 202, an alcohol treatment is applied on the surface of a substrate. The alcohol treatment is configured to provide surface reduction to help remove residue and/or oxides. The alcohol treatment may include using ethanol or methanol and the like. In some embodiments, the surface reduction may be accomplished using radicals produced from a remote plasma source in addition to the alcohol treatment. For an example, a substrate with a copper contact and an aluminum-based etch stop layer will be used to illustrate the method 200, but the example and materials are not meant to be limiting in any manner. FIG. 3 is a cross-sectional view 300 of a substrate 302 with an etch stop layer 310 with an exposed surface 314. A first low-k dielectric layer 308 of the substrate 302 has an embedded copper contact 306 surrounded by a copper barrier layer 304 to prevent migration of the copper into the first low-k dielectric layer 308. The etch stop layer 310 separates the first low-k dielectric layer 308 from a second low-k dielectric layer 312. The substrate 302 has been previously etched to open a via 318 in the substrate 302. The embedded copper contact 306 has subsequently oxidized forming a copper oxide layer 316 at a bottom of the via 318. The alcohol treatment may be used to reduce the metal oxide.

Figure 4:
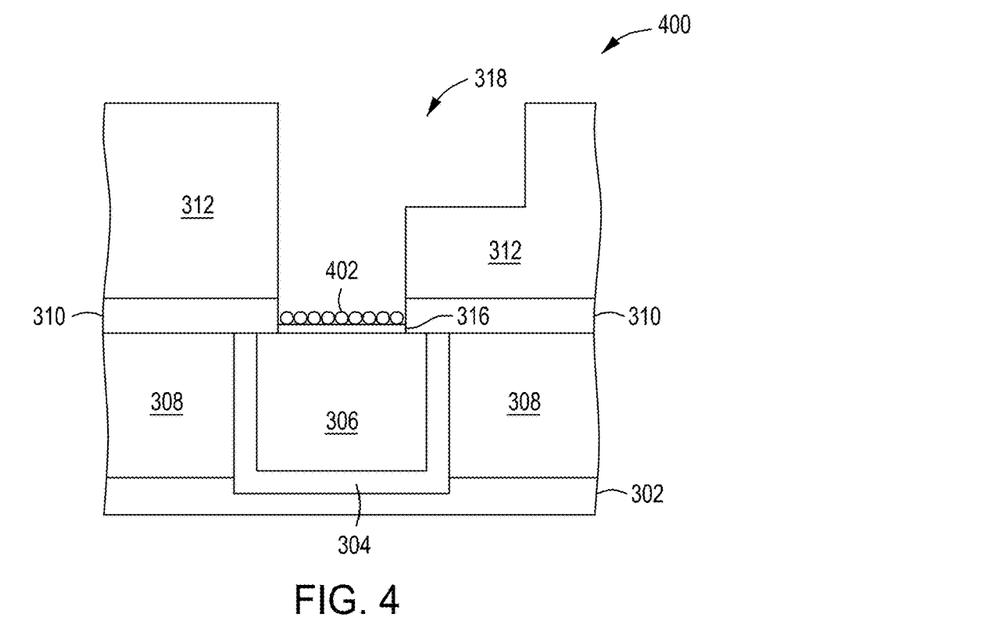
FIG. 4 depicts a cross-sectional view of a substrate being cleaned with an alcohol treatment in accordance with some embodiments of the present principles.
Figure 5:
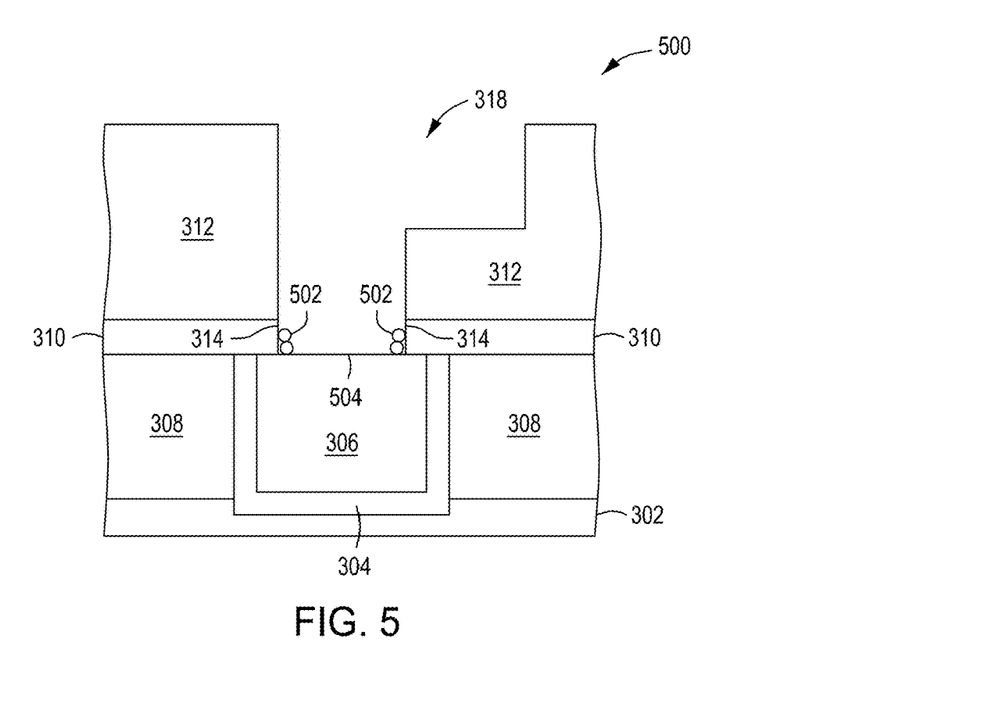
FIG. 5 depicts a cross-sectional view of a substrate after an alcohol treatment in accordance with some embodiments of the present principles.
Figure 6:
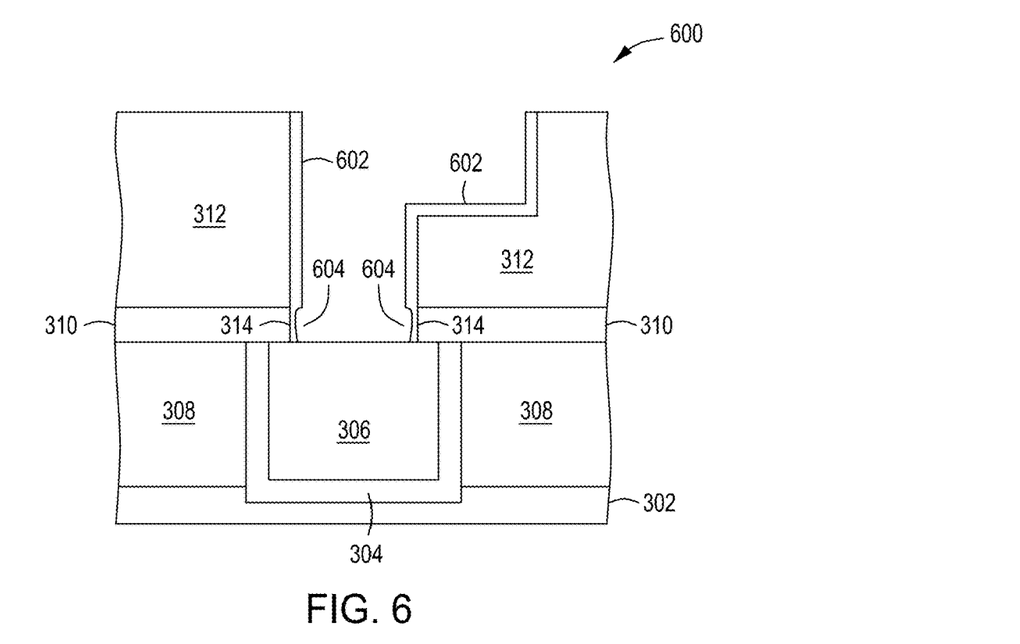
FIG. 6 depicts a cross-sectional view of a substrate with a barrier layer without a water treatment in accordance with some embodiments of the present principles.

In a cross-sectional view 400 of FIG. 4, the substrate 302 is treated with alcohol 402 that helps to reduce the copper oxide layer 316. The cleaning process will continue until the metal oxide has been removed (by chemical reduction) from the embedded copper contact 306. In a cross-sectional view 500 of FIG. 5, a surface 504 of the embedded copper contact 306 has been cleaned of any oxide and is ready for further processing. However, some alcohol 502 remains absorbed by the exposed surface 314 of the etch stop layer 310. If left on the exposed surface 314, the alcohol 502 will cause a nucleation delay in subsequent barrier layer formations. The nucleation delay reduces the selectivity of the etch stop layer 310 causing the barrier layer to be thinned out. In a cross-sectional view 600 of FIG. 6, a barrier layer 602 is formed on the etch stop layer 310 after the alcohol treatment has been performed. The nucleation delay due to residual alcohol on the etch stop layer 310 causes the barrier layer 602 to be reduced in thickness 604 on the exposed surface 314 of the etch stop layer 310.

Figure 7:
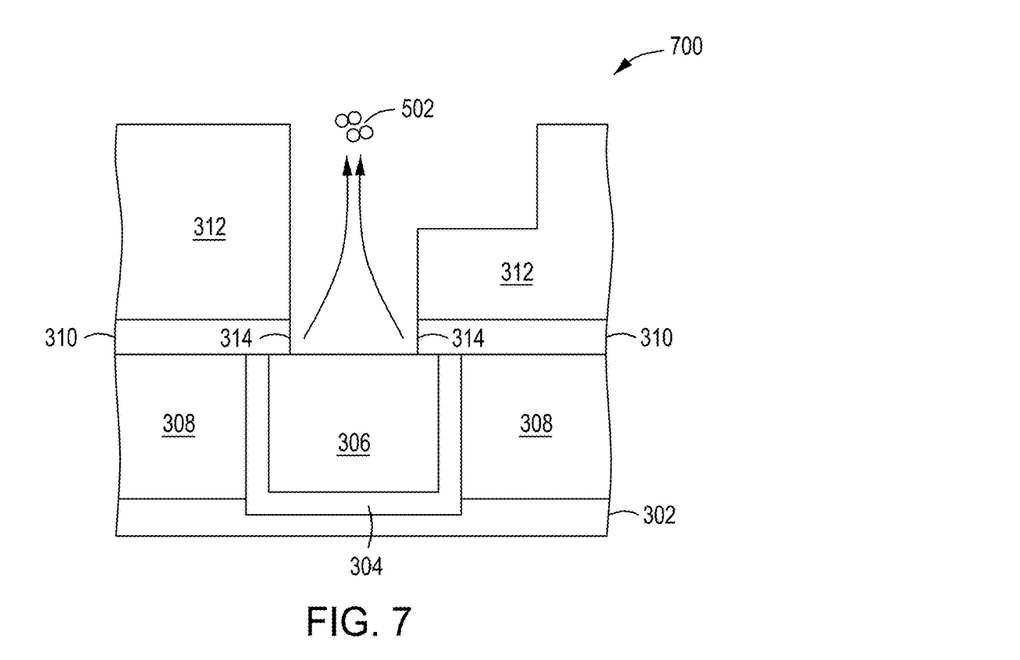
FIG. 7 depicts a cross-sectional view of a substrate after a water treatment in accordance with some embodiments of the present principles.
Figure 8:
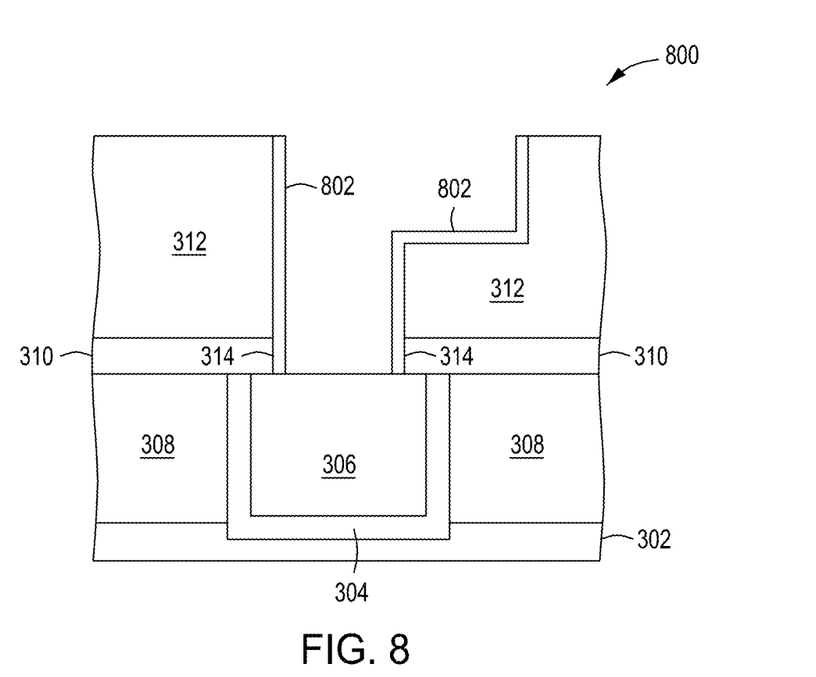
FIG. 8 depicts a cross-sectional view of a substrate with a barrier layer after a water treatment in accordance with some embodiments of the present principles.

In block 204, a water treatment is applied to the surface of the substrate. The water treatment removes the absorption of alcohols such as ethanol and methanol and the like from surfaces such as, but not limited to, metal oxides such as aluminum oxide and the like to recover the selectivity of the surfaces. The water treatment is configured to enhance the selectivity of the exposed surface 314. The enhanced selectivity allows for barrier layers to be formed on the exposed surface without nucleation delay which can thin the barrier layer. As shown in the cross-sectional view 700 of FIG. 7, the enhanced selectivity is due to the removal of the alcohol 502 from the exposed surface 314. During testing, the inventors found that after alcohol is used as a reducing agent the substrate cannot be fully cleaned of the alcohol, leaving an alcohol-based residue behind that impacts, for example, tantalum nitride growth on aluminum oxide and other surfaces. The growth reduction is due to a nucleation delay caused by the residual alcohol on the exposed surface such as, for example, an exposed surface of an aluminum oxide etch stop layer. In some instances, the nucleation delay may cause up to 50% or more reduction in a barrier layer thickness. The inventors found that if water was introduced during the alcohol treatment or after the alcohol treatment, the thickness of a barrier layer 802 on the exposed surface 314 could be recovered as depicted in the cross-sectional view 800 of FIG. 8. The inventors found that the barrier layer thickness could be restored to approximately 80% or more depending on the type and duration of the water treatment. In some cases, the percentage of recovery is a balance between the duration of the water treatment and a sufficient level of recovery for a given process. The longer the water treatment lasts, the lower the throughput of the process. In some instances, higher throughput demands may require shorter water treatment times and yield less than 100% recovery (which may still be satisfactory for a given process).

In some embodiments, the water treatment uses water flowed over the surface of the substrate. The water may be supplied, for example, by the first optional ampoule 152 which contains water in a liquid state. The water is then vaporized by vapor draw, bubbling, or carrier gas to deliver gas phase water into the process chamber 100. The inventors have found that water, $H_2O$, provides hydrogen bonding with alcohols such as ethanol and methanol and the like. The alcohol bonds to the water molecules and is then washed away by the flow of the water. As noted above, the water may be flowed over the surface in conjunction with the alcohol treatment or after the alcohol treatment. In some embodiments, the water treatment uses water in conjunction with an inert gas, such as, but not limited to, helium or argon and the like. Thus, the water may be less than 100% if an inert gas is used. The percentage of water is the vaporized water portion of the total water treatment which includes both the vaporized water and the inert gas. In some embodiments, the water is flowed over the substrate for approximately 10 seconds to approximately 60 seconds. In some embodiments, the water is flowed over the substrate for approximately 30 seconds. The inventors have found that less water in the system increases overall performance and throughput. Temperature and pressure may affect the amount of water on a substrate surface. The inventors have found that a lower pressure helps to remove the water more quickly from the surface of the substrate. In some embodiments, the pressure of the chamber is approximately 200 mTorr to approximately 1000 mTorr. In some embodiments, the pressure is approximately 500 mTorr. If the temperature of the substrate is kept above approximately 100 degrees Celsius, the water at the surface of the substrate is more easily reabsorbed into the chamber environment. In some embodiments, the temperature of the substrate is approximately 60 degrees Celsius to approximately 450 degrees Celsius. In some embodiments, the temperature is approximately 345 degrees Celsius. In some embodiments, the alcohol treatment and the water treatment are performed at the same temperature to increase efficiency and throughput (no heating or cooling period required between treatments).

In some embodiments, the water treatment uses hydrogen radicals and/or oxygen radicals produced by injecting water and/or a carrier gas into a plasma generated in a remote plasma source (RPS). The inventors have found that plasma-based water treatment may damage low-k materials by depleting carbon from the low-k materials. Care is to be taken when using the plasma water treatment that only an acceptable amount of carbon is removed or that no low-k material is present on the substrate. In some situations, carbon depletion of the low-k material may be tolerable as the carbon depletion does not necessarily negatively affect the properties of the low-k material for certain uses. The carbon depletion makes the low-k material more porous, making the low-k material even lower. In some circumstances, the lowering of the low-k material may be advantageous. Non-low-k materials such as silicon oxide will not be affected by the plasma water treatment. An advantage of the plasma water treatment is that many preclean chambers are already configured to produce plasma and have some form of plasma gas source that can accommodate water injection into the plasma.

In some embodiments of the plasma water treatment, the plasma is ignited using argon or helium gas and then injected with water or water and a carrier gas. For example, the plasma gas source 170 of FIG. 1 may supply the process gases and/or water and/or water and carrier gases. The inventors have found that when the water is injected into the plasma, the water partially ionizes producing hydrogen radicals, oxygen radicals, and oxygen-hydrogen radicals such as OH and OOH. In some embodiments, ions will be filtered out before reaching the surface of the substrate, leaving predominantly radicals to impinge the substrate surface. The inventors have discovered that the radicals absorb the alcohol from the surface of the substrate. In some embodiments, the water treatment using plasma has a duration of approximately 5 seconds to approximately 100 seconds. In some embodiments, a water treatment mixture of water and a carrier gas may have a percentage of water from greater than 0% to approximately 100% (e.g., no carrier gas used). The inventors have found that with 100% water (without a carrier gas) metal surfaces (e.g., copper, etc.) on the substrate do not oxidize. In some embodiments, the water treatment mixture may be from approximately 1% to approximately 50% water. In some embodiments, the water treatment mixture may be approximately 50% water. In some embodiments, the carrier gas may be helium or argon and the like. In some embodiments, the duration of the water treatment with plasma is approximately 5 seconds to approximately 120 seconds. The inventors have found that if the pressure in the chamber is too high, underlying layers of the substrate will start oxidizing. In some embodiments, the pressure may be from greater than zero to less than 1 Torr.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of cleaning a surface of a substrate, comprising:
    applying an alcohol treatment on a surface of the substrate, the alcohol treatment configured to provide surface reduction of a first metal oxide layer from an underlying metal layer on the substrate; and
    applying a water treatment to the surface of the substrate simultaneously with the alcohol treatment, the water treatment configured to remove alcohol from the alcohol treatment from a second metal oxide layer different from the first metal oxide layer, wherein the second metal oxide layer separates a first low-k dielectric layer from a second low-k dielectric layer on the substrate.

2. The method of claim 1, wherein the alcohol treatment includes ethanol or methanol.

3. The method of claim 1, wherein the surface of the substrate includes at least a portion of an etch stop layer.

4. The method of claim 1, wherein the alcohol treatment and water treatment are performed at a pressure of greater than zero Torr to approximately 1 Torr.

5. The method of claim 1, wherein the water treatment is performed using a remote plasma source (RPS).

6. The method of claim 1, wherein the surface of the substrate includes at least a portion of a contact surface.

7. The method of claim 1, wherein the alcohol treatment is performed until the underlying metal surface beneath the first metal oxide layer is exposed.

8. The method of claim 1, wherein the surface reduction of the first metal oxide layer includes removing at least a portion of a copper oxide layer on a copper contact.

9. The method of claim 1, wherein the water treatment has a duration of approximately 5 seconds to approximately 120 seconds.

10. The method of claim 1, wherein the water treatment includes a water treatment mixture including a carrier gas and water used to produce a plasma.

11. The method of claim 10, wherein the water treatment mixture has greater than zero to approximately 100% water.

12. The method of claim 11, wherein the water treatment mixture has approximately 50% water.

13. The method of claim 10, wherein the carrier gas is helium or argon.

14. A method of cleaning a surface of a substrate, comprising:
    applying an alcohol treatment on a surface of the substrate, the alcohol treatment configured to provide surface reduction of a first metal oxide layer from an underlying metal layer on the substrate; and
    applying a water treatment to the surface of the substrate for a duration of approximately 5 seconds to approximately 120 seconds and at a pressure of greater than zero Torr to approximately 1 Torr while simultaneously applying the alcohol treatment, wherein the water treatment includes exposing the surface of the substrate to hydrogen radicals or oxygen radicals generated by injecting a water treatment mixture into plasma, and wherein the water treatment is configured to remove alcohol from the alcohol treatment from a second metal oxide layer different from the first metal oxide layer, wherein the second metal oxide layer separates low-k dielectric layers.

15. The method of claim 14, wherein the water treatment mixture includes water and a carrier gas.

16. The method of claim 15, wherein the carrier gas is helium or argon.

17. The method of claim 15, wherein the water treatment mixture contains greater than zero to approximately 100% water.

18. The method of claim 17, wherein the water treatment mixture contains approximately 50% water and approximately 50% of the carrier gas.

19. A non-transitory, computer readable medium having instructions stored thereon that, when executed, cause a method for cleaning a surface of a substrate to be performed, the method comprising:
    applying an alcohol treatment on a surface of the substrate, the alcohol treatment configured to provide surface reduction of a first metal oxide layer from an underlying metal layer on the substrate; and
    applying a water treatment to the surface of the substrate simultaneously with the alcohol treatment, the water treatment configured to remove alcohol from the alcohol treatment from a second metal oxide layer different from the first metal oxide layer, wherein the second metal oxide layer separates low-k dielectric layers.

20. The non-transitory, computer readable medium of claim 19, further comprising:

performing the alcohol treatment and the water treatment at a pressure of greater than zero Torr to approximately 1 Torr;

performing the water treatment with a mixture including a carrier gas and water to produce a plasma; or performing the water treatment for a duration of approximately 5 seconds to approximately 120 seconds.

\* \* \* \* \*